US006549471B1

(12) United States Patent
Zivanovic

(10) Patent No.: US 6,549,471 B1
(45) Date of Patent: Apr. 15, 2003

(54) ADIABATIC DIFFERENTIAL DRIVER

(75) Inventor: Branimir Zivanovic, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/073,722

(22) Filed: Feb. 11, 2002

(51) Int. Cl.[7] .............................................. G11C 7/00
(52) U.S. Cl. .......................... 365/189.05; 365/230.06; 365/202; 365/194
(58) Field of Search ..................... 365/189.05, 230.06, 365/202, 194, 189.11

(56) References Cited

U.S. PATENT DOCUMENTS

| 5,748,556 A | 5/1998 | Iyengar |
|---|---|---|
| 5,875,140 A | 2/1999 | Merritt et al. |
| 5,933,372 A | 8/1999 | Seyyedy et al. |
| 6,330,196 B1 | 12/2001 | Protzman |
| 6,381,180 B1 | 4/2002 | Merritt et al. |
| 6,411,553 B1 | 6/2002 | Wright et al. |
| 6,452,833 B2 * | 9/2002 | Akita et al. ............ 365/230.06 |

* cited by examiner

Primary Examiner—Huan Hoang
(74) Attorney, Agent, or Firm—Leffert Jay & Polglaze, P.A.

(57) ABSTRACT

A differential driver circuit includes an output connection equilibration circuit. The equilibration circuit balances the output connection voltages to reduce current consumption when transitioning the driver between data states. Equilibrating the differential driver can reduce the current consumption experienced by prior circuits. In one embodiment, the driver circuit is placed in a tri-state condition while the output connections are electrically shorted together. After the output connection have reduced their voltage differential, or reached an intermediate equal level, the driver circuit(s) are activated.

28 Claims, 6 Drawing Sheets

ADIABATIC DIFFERENTIAL DRIVER

TECHNICAL FIELD OF THE INVENTION

The present invention relates generally to differential driver circuitry and in particular the present invention relates to differential driver circuitry with reduced power consumption.

BACKGROUND OF THE INVENTION

Differential driver circuitry traditionally includes two inverter circuits to provide complimentary output signals. The inverters consume power when driving the output signals. Increased power consumption is experienced when changing the outputs from one data state to another. Different power conservation techniques have been implemented to reduce the power used by the drivers. For example, power-down signals can be used to either reduce the drive level or disable unused buffers and drivers. In addition, unbalanced inverters can be used to steer current in specific directions, such as a clock driver circuit having unbalanced inverters to provide a stronger device pull-up on clock and a stronger pull-down device on clock compliment.

For the reasons stated above, and for other reasons stated below which will become apparent to those skilled in the art upon reading and understanding the present specification, there is a need in the art for a differential driver circuit that has a reduced current consumption during operation.

SUMMARY OF THE INVENTION

The above-mentioned problems with differential driver circuitry and other problems are addressed by the present invention and will be understood by reading and studying the following specification.

In one embodiment, an integrated circuit differential driver comprises first and second driver circuits respectively coupled to first and second output connections, and equilibration circuitry coupled between the first and second output connections to selectively equalize voltages on the first and second output connections.

In another embodiment, a differential driver circuitry comprises a first driver circuit to provide an output signal on a first output connection in response to a first input signal, a second driver circuit to provide an output signal on a second output connection in response to a second input signal, and tri-state circuitry to selectively place the first and second driver circuits in tri-state. An equilibration circuit is coupled between the first and second output connections to selectively equalize voltages on the first and second output connections while the first and second driver circuits are tri-stateed.

A memory device comprises a memory array to store data, first and second output connections to provide differential output signals, and a differential driver circuit coupled to the two output connections. The differential driver circuit comprises first and second drivers respectively coupled to the first and second output connections, and equilibration circuitry coupled between the first and second output connections to selectively equalize voltages on the first and second output connections.

A method of operating a driver circuit comprises receiving differential input signals, placing the driver circuit in a tri-state in response to the input signals transitioning logic levels, and performing an equilibration operation on output connections of the driver circuit while the driver circuit is tri-state.

Another method of operating a driver circuit comprising receiving differential input signals, detecting a transition in the input signals, and placing the driver circuit in a tri-state for a predetermined period of time when the transition is detected. A transistor coupled between output connections is activated for the predetermined time period to perform an equilibration operation on output connections of the driver circuit.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention provides a differential driver circuit that includes an equilibration circuit. The equilibration circuit balances the output voltages to reduce current consumption when transitioning the driver between states. As explained below, equilibrating the differential driver can reduce the current consumption experienced by prior circuits.

Figure 1:
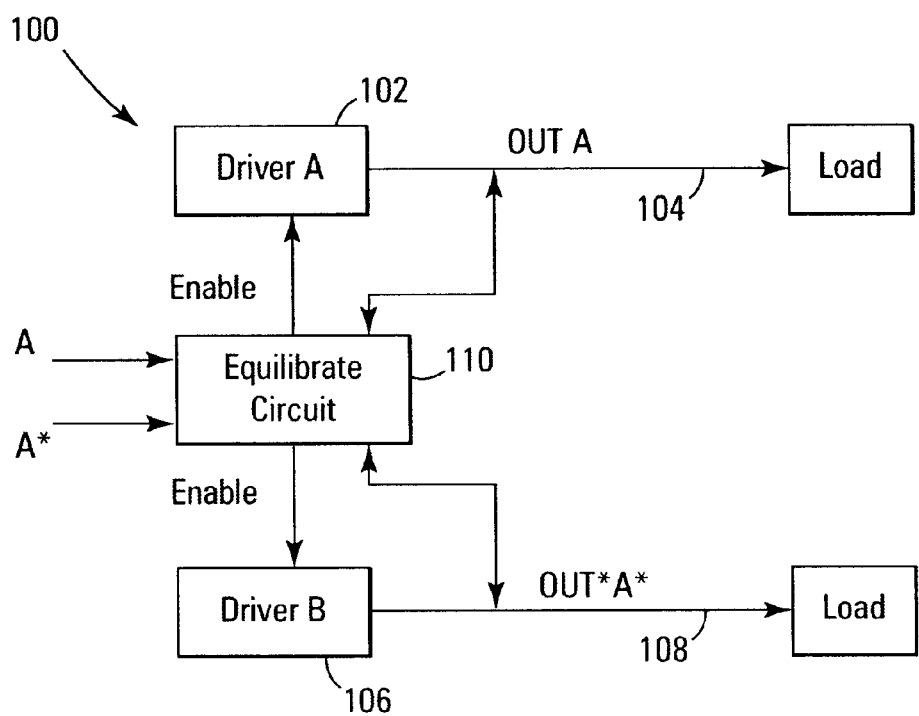
FIG. 1 is a block diagram of an embodiment of the present invention.
Figure 3:
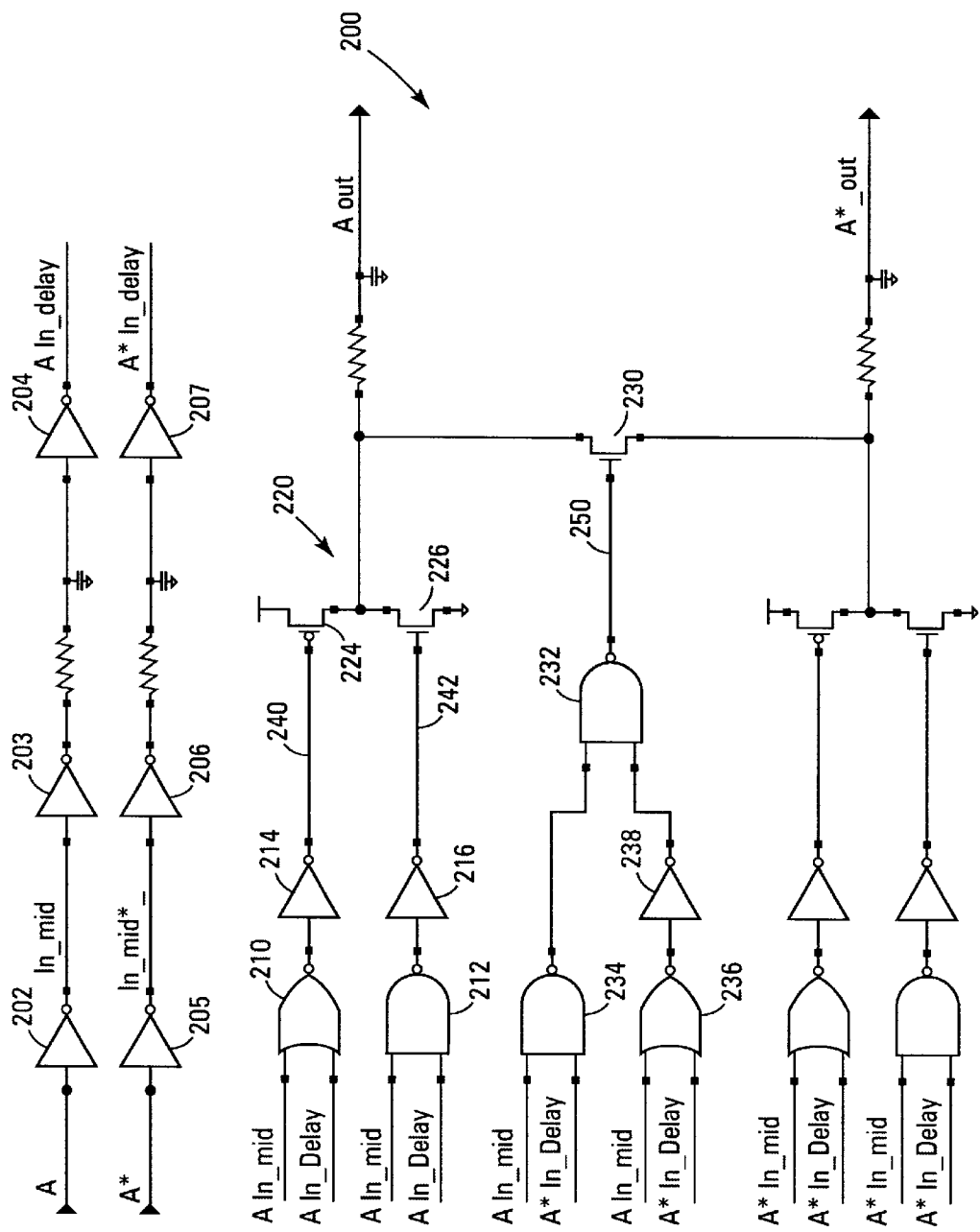
FIG. 3 is a schematic diagram of an embodiment of the present invention.

Referring to FIG. 1, a block diagram of an embodiment 100 of the present invention is described. The differential driver circuit includes driver A 102 to provide an output signal on output A 104, and a driver B 106 to provide a compliment output signal on output A* 108. Drivers A and B can be standard driver circuits with tri-state enable/disable capability. Both output A and A* are coupled to an equilibrate circuit 110. The equilibrate circuit monitors transitions on inputs A and A*, tri-states the drivers and shorts outputs A and A* to substantially equilibrate the outputs. After the equilibration is complete, the drivers are re-enabled. One embodiment is illustrated in FIG. 3 and described below.

A prior art differential driver circuit is described with reference to FIG. 2. The driver circuit has first and second inputs A and A* which provide first and second outputs A_out and A*_out. Each driver circuit includes series coupled inverters having p-channel pull-up transistors and n-channel pull-down transistors. In operation, if input A transitions to a high state the first pull-down transistor 120 is activated which in turn activates the second pull-up transistor 126. Output A_out 129 is pulled to a high state.

Likewise, input A* transitions to a low state which activates the first p-channel pull-up transistor 130 and the second pull-down transistor 132 to pull output A*_out 131 low.

When the input signal transition states, a rather significant current is required to either pull or push the output connections to an appropriate state. As explained below, the present invention addresses this current consumption.

Referring to FIG. 3, a schematic diagram of one possible embodiment 200 of the present invention is described. It will be appreciated that additional embodiments are possible and the present invention is not limited to the specific circuitry illustrated. The differential driver circuit of FIG. 3 includes two input connections A and A*. These inputs are each coupled to series connected inverters 202–204 and 205–207 to provide delay paths. An intermediate location along the delay path is used to provide a first input signal (A In_mid, A* In_mid) and the last inverter of the delay path is used provide a second input signal (A In_delay, A* In_delay). It will be appreciated by those skilled in the art with the benefit of the present description that the first input signal can be A or A* and that the length of the delay path depends upon the circuitry design implemented.

Both of the signal paths for the differential driver circuit are the same. As such the following description will focus on the A signal path. It will be understood that the comments also apply to the circuitry and operation of the A* signal path. The A signal path includes a NOR circuit 210, a NAND circuit 212, first and second inverters 214 and 216, and a push/pull circuit 220 coupled to the inverters. Each of the NOR and NAND gates have a first input coupled to receive the A In_mid signal and a second input coupled to receive the A In_delay signal. The NOR gate provides an output signal that controls the p-channel pull-up transistor 224 of the push/pull circuit. Likewise, the NAND gate provides an output signal that controls the n-channel pull-down transistor 226 of the push/pull circuit.

In operation, both A In_mid and A In_delay will reach the same state after the input signals propagate through the delay path. As such, either the NOR or NAND gate activate a transistor of the push/pull circuit. For example, if A is a steady high state the NAND gate 212 provides a low signal output that is inverted and activates the n-channel pull-down transistor 226. The NOR gate 210 output is low which is inverted and keeps the p-channel pull-up transistor 224 off. If the A input is a steady state low, the NAND gate activates the pull-up transistor and the NOR gate turns the pull-down transistor off.

When the input signals transition states, the inputs to the NAND and NOR gates are different. That is, the delay path establishes a time when In_mid and In_delay are at different logic levels. Because the NAND and NOR gates have a difference between their input signals, both the pull-up and pull-down transistors are turned off to tri-state the driver output signal A_out. That is, the NOR gate output is low and the NAND gate output is high when their input signals are different.

While the driver circuits are tri-stated, the output nodes are equilibrated by n-channel transistor 230 coupled between the outputs A_out and A*_out. The equilibrate transistor is controlled by NAND gates 232/234, NOR gate 236, and inverter 238. NAND gate 234 and NOR gate 236 are coupled to receive A In_mid and A* In_delay. In operation, when the input signals transition data states NAND gate 234 provides a high pulse signal to activate the equilibrate transistor 230. For example, if the A input signal transitions to a high state the A In_mid signal is low while the A* In_delay signal is low. As a result, the output of NAND gate 234 is high and the output of NOR gate 236 is high (low output from inverter 238). The inputs to NAND gate 232 are low to provide a high pulse ouput signal. The delay path of the series inverters determines the length of the pulse. When A* propagates through the delay path, A* In_delay goes high and the inputs to NAND gate 234 go low to turn off the equilibrate transistor.

Figure 4:
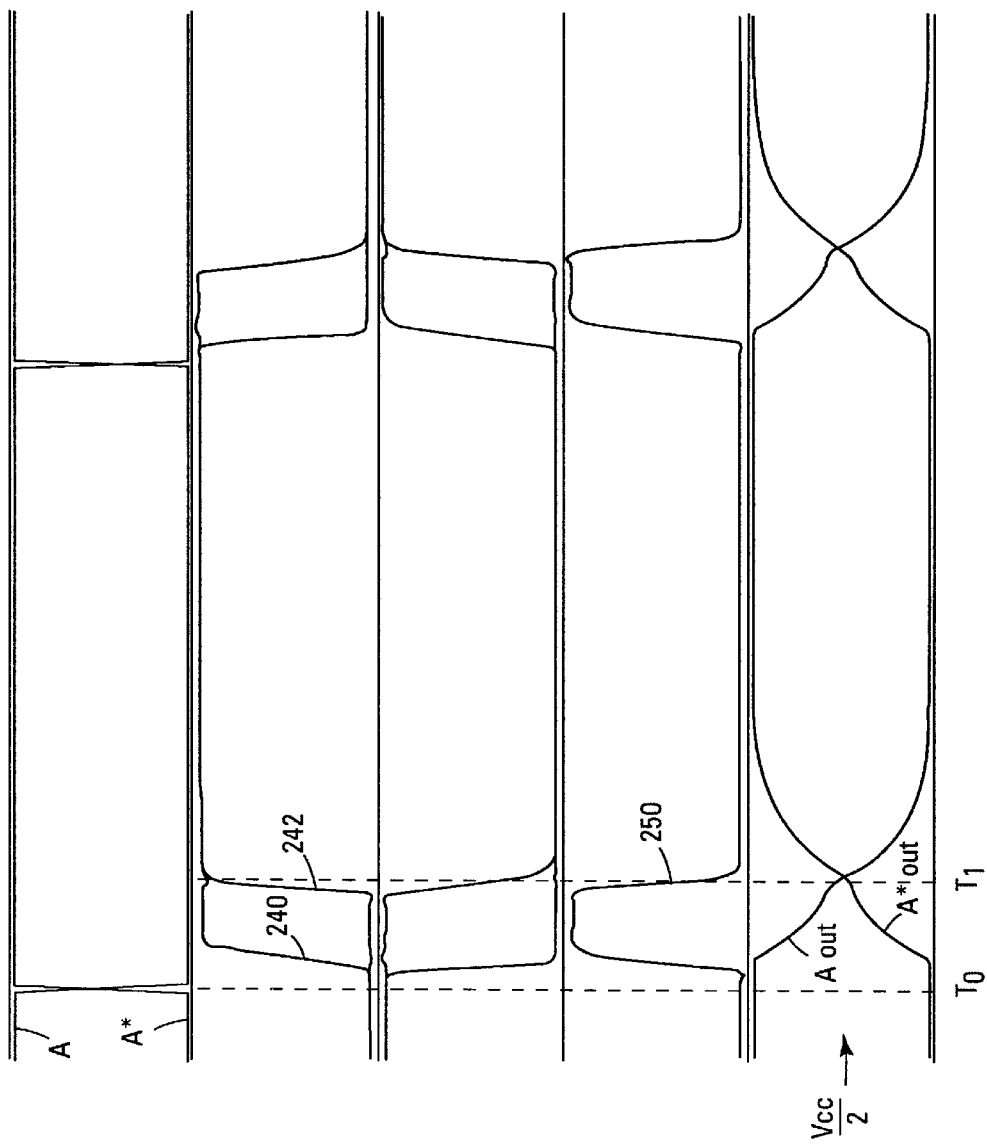
FIG. 4 is a timing diagram of the operation of the circuit of FIG. 3.

Referring to FIG. 4, the dynamic operation of the driver circuit of FIG. 3 is described in greater detail. At time T0, inputs A and A* transition from high and low states to low and high state, respectively. In response to the input transitions, the gate signal 240 of pull-up transistor 224 goes high and the gate signal 242 of pull-down transistor 226 remains low. As such the driver is place in a tri-state. At time T1, the input signals have propagated through the delay paths and the gate signal of pull-down transistor is pulled high. The A output signal is therefore pulled low by the driver.

In a similar manner, in response to the input transitions at T0, the A*_out driver is place in a tri-state. At time T1, the input signals have propagated through the delay paths and the gate of pull-up transistor is pulled low. The A* output signal is therefore pulled high by the driver.

The gate voltage 250 of the equilibrate transistor 230 is illustrated in FIG. 4. An inverter delay after time T0, the gate signal 250 goes high and remains high until time T1. During this equilibrate time, the output connections are coupled together. As illustrated, the voltage levels of the output connections begin to equilibrate, or meet, to a common voltage level. The output connections reach an intermediate voltage, such as Vcc/2, by the time the equilibrate pulse ends. Although not described in detail, FIG. 4 also illustrates the circuit operation when the input signals transition in the opposite direction.

Figure 2:
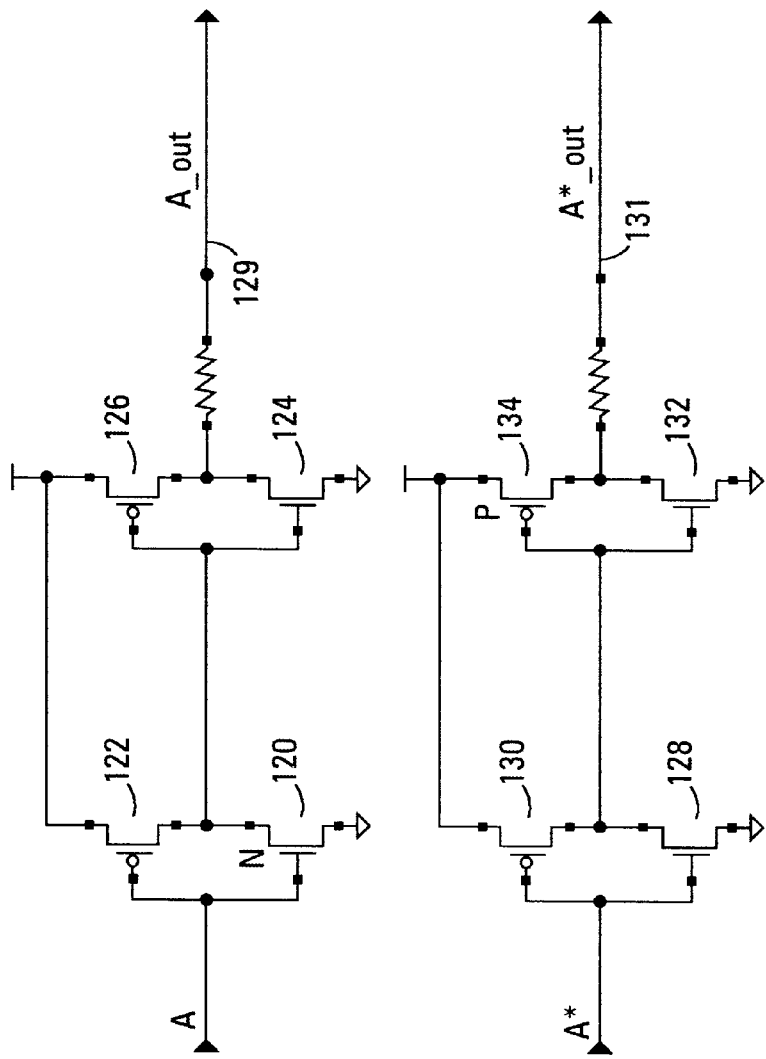
FIG. 2 is a schematic diagram of a prior art driver circuit.
Figure 5:
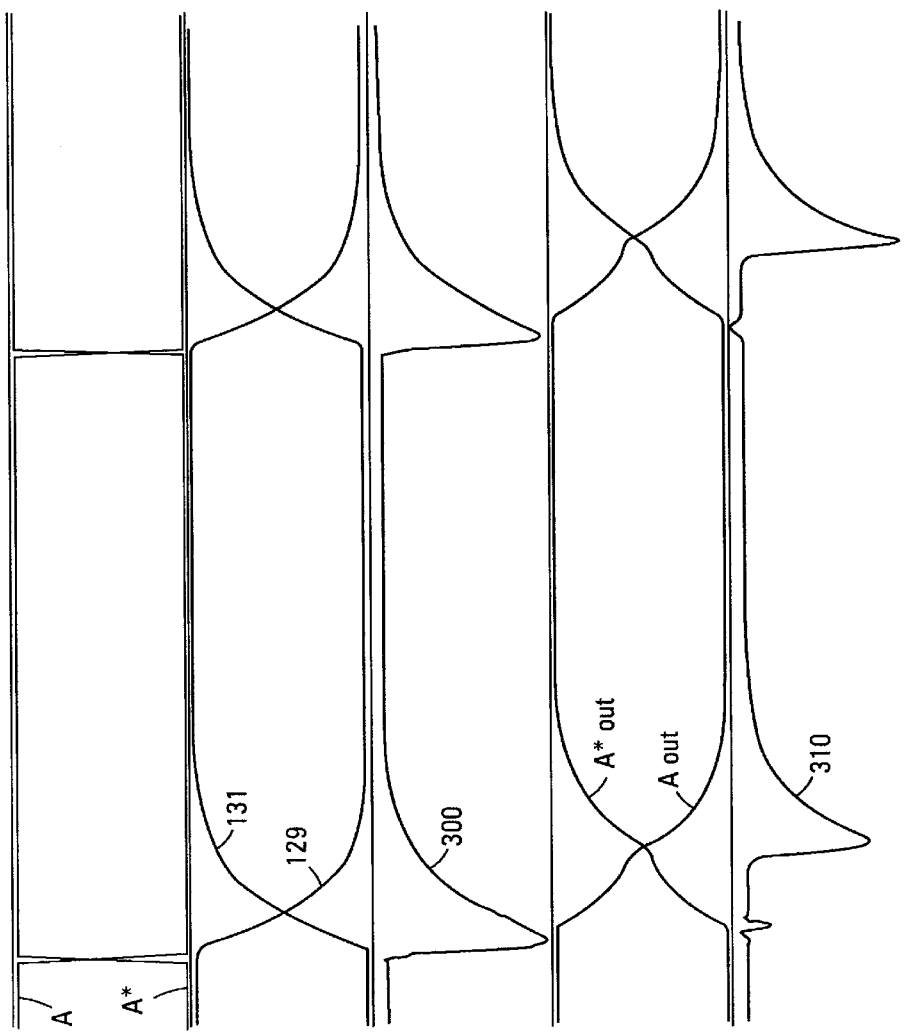
FIG. 5 is a timing diagram comparing the operation of the circuits of FIGS. 2 and 3.

FIG. 5 compares the operation of the prior art driver circuit of FIG. 2 and the embodiment of FIG. 3. As illustrated, when the input signals transition states the prior art circuit output signals 129 and 131 also transition. As substantial current draw is experienced during this transition (see plot 300). In contrast, the output signals of the embodiment described above transitions to an equilibrated level before completing a transition to the final voltage levels. The current draw is reduced from the prior art (see plot 310). In simulations, the average power dissipation was 3.137 mW compared to 4.462 mW for the prior art. This translates into a 29.7% power savings. There is a response time difference between the two circuits. This is primarily due to the delay time required to reach an equilibrated level. In an alternate embodiment, the equilibrate circuit can be turned off prior to reaching a fully equilibrated level by using a shorter delay path. That is, reducing the differential between the output connections prior to activating the drivers reduces power consumption. Thus, the specific implementation can be adjusted for the desired power reduction and timing specifications.

Figure 6:
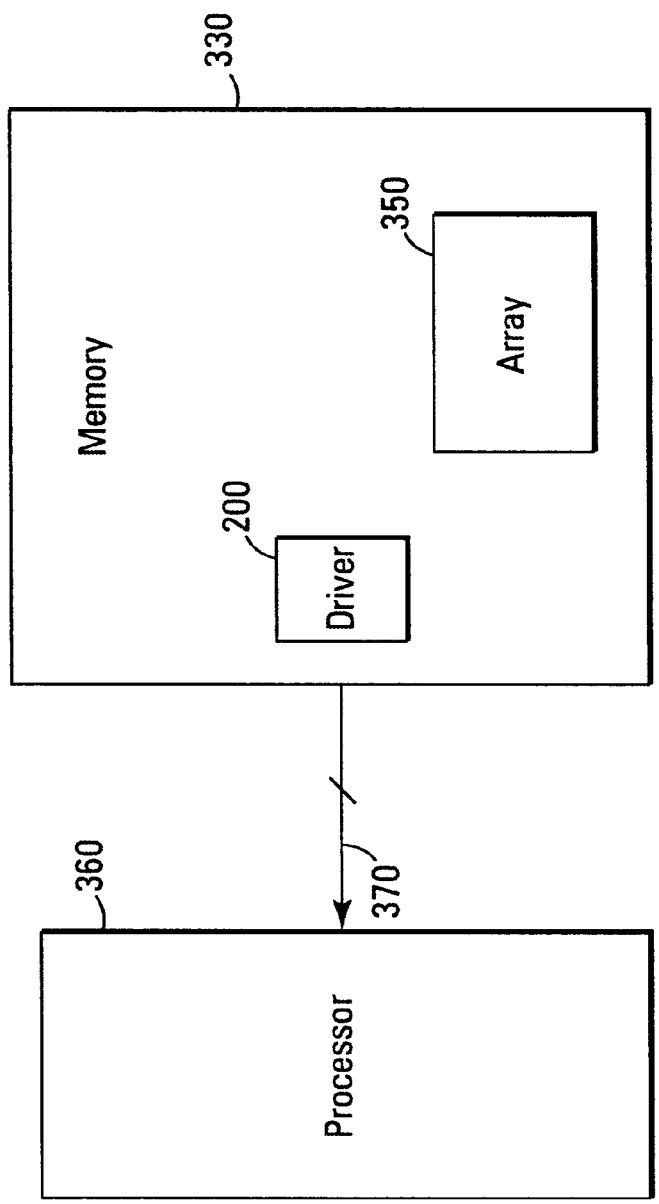
FIG. 6 is a block diagram of a memory device of an embodiment of the present invention.

The present differential driver circuitry can be implemented on any number of different devices. For example, the signal drivers can be used to communicate data signals from a memory device to an external bus. FIG. 6 is a block diagram that illustrates a memory device 330, such as a DRAM, SDRAM, flash, or other volatile or non-volatile memory device, having a memory array 350 to store data. The memory includes one or more driver circuits 200, as described above, to provide output signals to an external processor 360 via a communication bus 370, or data outputs.

CONCLUSION

A differential driver circuit has been described that includes an equilibration circuit. The equilibration circuit balances the output connection voltages to reduce current consumption when transitioning the driver between data states. Equilibrating the differential driver can reduce the current consumption experienced by prior circuits. In one embodiment, the driver circuit is placed in a tri-state condition while the output connections are electrically shorted together. After the output connection have reduced their voltage differential, or reached an intermediate equal level, the driver circuit(s) are activated.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit differential driver comprising:
   first and second driver circuits respectively coupled to first and second output connections; and
   equilibration circuitry coupled between the first and second output connections to selectively equalize voltages on the first and second output connections in response to the equilibration circuitry detecting a transition on input signals to the differential driver.

2. The integrated circuit differential driver of claim 1 further comprising logic circuitry to place the first and second driver circuits in a tri-state condition when the equilibration circuitry is activated.

3. The integrated circuit differential driver of claim 1 further comprising first and second delay circuits coupled to receive input signals to the integrated circuit differential driver.

4. The integrated circuit differential driver of claim 1 wherein the equilibration circuitry comprises a transistor coupled between the first and second output connections.

5. The integrated circuit differential driver of claim 1 wherein the first and second driver circuits each comprise first and second inverter circuits.

6. A differential driver circuitry comprising:
   a first driver circuit to provide an output signal on a first output connection in response to a first input signal;
   a second driver circuit to provide an output signal on a second output connection in response to a second input signal;
   tri-state circuitry to selectively place the first and second driver circuits in tri-state; and
   an equilibration circuit coupled between the first and second output connections to selectively equalize voltages on the first and second output connections, in response to transitions on signals used to derive the first and second input signals, while the first and second driver circuits are tri-state.

7. The differential driver circuitry of claim 6 wherein the equilibration circuitry comprises a transistor coupled between the first and second output connections.

8. The differential driver circuitry of claim 6 wherein the tri-state circuitry determines when an input signal is transitioning logic states and places the first and second driver circuits in tri-state for a predetermined period of time.

9. The differential driver circuitry of claim 8 wherein the tri-state circuitry receives first and second control signals, where the second control signal is a delayed version of the first control signal.

10. A differential driver circuitry comprising:
    a first driver circuit to provide an output signal on a first output connection, wherein the first driver circuit has first pull-up and pull-down circuits;
    a first logic circuit to control the first pull-up circuit, wherein the first logic circuit provides an output signal in response to a first input signal and a delayed version of the first input signal;
    a second logic circuit to control the first pull-down circuit, wherein the second logic circuit provides an output signal in response to the first input signal and the delayed version of the first input signal;
    a second driver circuit to provide an output signal on a second output connection, wherein the second driver circuit has second pull-up and pull-down circuits;
    a third logic circuit to control the second pull-up circuit, wherein the third logic circuit provides an output signal in response to a second input signal and a delayed version of the second input signal;
    a fourth logic circuit to control the second pull-down circuit wherein the fourth logic circuit provides an output signal in response to the first input signal and the delayed version of the second input signal; and
    an equilibration circuit coupled between the first and second output connections to selectively equalize voltages on the first and second output connections while the first and second driver circuits are tri-state, wherein the equilibration circuit provides an output in response to the first input signal and the delayed version of the second input signal.

11. The differential driver circuitry of claim 10 wherein the equilibration circuit comprises:
    a transistor coupled between the first and second output connections; and
    a fifth logic circuit coupled to provide a gate signal to the transistor in response to the first input signal and the delayed version of the second input signal.

12. The differential driver circuitry of claim 10 wherein the fifth logic circuit comprises:
    a first NAND gate having a first input coupled to receive the first input signal and a second input coupled to receive the delayed version of the second input signal;
    a NOR gate having a first input coupled to receive the first input signal and a second input coupled to receive the delayed version of the second input signal;
    a second NAND gate having a first input coupled to an output of the first NAND gate and a second input coupled to an output of the NOR gate via an inverter, wherein the second NAND gate is coupled to a gate connection of the transistor.

13. The differential driver circuitry of claim 10 wherein the first logic circuit comprises:
    a NOR gate having a first input coupled to receive the first input signal and a second input coupled to receive the delayed version of the first input signal; and
    an inverter coupled between an output of the NOR gate and the first pull-up circuit.

14. The differential driver circuitry of claim 10 wherein the second logic circuit comprises:
    a NAND gate having a first input coupled to receive the first input signal and a second input coupled to receive the delayed version of the first input signal; and an inverter coupled between an output of the NAND gate and the first pull-down circuit.

15. The differential driver circuitry of claim 10 wherein the third logic circuit comprises:

a NOR gate having a first input coupled to receive the second input signal and a second input coupled to receive the delayed version of the second input signal; and an inverter coupled between an output of the NOR gate and the second pull-up circuit.

16. The differential driver circuitry of claim 10 wherein the fourth logic circuit comprises:

a NAND gate having a first input coupled to receive the second input signal and a second input coupled to receive the delayed version of the second input signal; and an inverter coupled between an output of the NAND gate and the second pull-down circuit.

17. A memory device comprising:

a memory array to store data;

first and second output connections to provide differential output signals; and a differential driver circuit coupled to the two output connections comprising, first and second drivers respectively coupled to the first and second output connections, and equilibration circuitry coupled between the first and second output connections to selectively equalize voltages on the first and second output connections in response to transitions of the differential output signals.

18. The memory device of claim 17 wherein the differential driver circuit further comprises logic circuitry to place the first and second driver circuits in a tri-state condition when the equilibration circuitry is activated.

19. The memory device of claim 17 wherein the equilibration circuitry comprises a transistor coupled between the first and second output connections.

20. A memory device comprising:

a memory array to store data;

first and second output connections to provide differential output signals;

a first driver circuit to provide an output signal on the first output connection in response to a first input signal;

a second driver circuit to provide an output signal on the second output connection in response to a second input signal;

tri-state circuitry to selectively place the first and second driver circuits in tri-state; and an equilibration circuit coupled between the first and second output connections to selectively equalize voltages on the first and second output connections, in response to transitions of the differential output signals, while the first and second driver circuits are tri-state.

21. The memory device of claim 20 wherein the equilibration circuitry comprises a transistor coupled between the first and second output connections.

22. A method of operating a driver circuit comprising:

receiving differential input signals;

placing the driver circuit in a tri-state in response to the input signals transitioning logic levels; and performing an equilibration operation on output connections of the driver circuit while the driver circuit is tri-state.

23. The method of claim 22 wherein the equilibration operation reduces a voltage differential between the output connections.

24. The method of claim 23 wherein the equilibration operation reduces a voltage differential between the output connections to substantially zero volts.

25. The method of claim 22 wherein the equilibrate operation comprises activating a transistor coupled between the output connection for a predetermined time period.

26. A method of operating a driver circuit comprising:

receiving differential input signals;

detecting a transition in the input signals;

placing the driver circuit in a tri-state for a predetermined period of time when the transition is detected; and activating a transistor coupled between output connections for the predetermined time period to perform an equilibration operation on output connections of the driver circuit.

27. The method of claim 26 wherein the equilibration operation reduces a voltage differential between the output connections to substantially zero volts.

28. An electronic system comprising:

a processor that controls the electronic system; and a memory device coupled to the processor, the memory device comprising:

a memory array to store data;

first and second output connections to provide differential output signals; and a differential driver circuit coupled to the two output connections comprising:

first and second drivers respectively coupled to the first and second output connections, and equilibration circuitry coupled between the first and second output connections to selectively equalize voltages on the first and second output connections in response to transitions of the differential output signals.

* * * * *